(12) United States Patent
Zanellato et al.

(10) Patent No.: US 12,218,287 B2
(45) Date of Patent: Feb. 4, 2025

(54) ELECTRONIC PACKAGE

(71) Applicant: STMICROELECTRONICS (GRENOBLE 2) SAS, Grenoble (FR)

(72) Inventors: Olivier Zanellato, Chambery (FR); Remi Brechignac, Grenoble (FR); Jerome Lopez, Saint Jean de Moirans (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 18/503,025

(22) Filed: Nov. 6, 2023

(65) Prior Publication Data
US 2024/0072214 A1    Feb. 29, 2024

Related U.S. Application Data

(63) Continuation of application No. 17/485,010, filed on Sep. 24, 2021, now Pat. No. 11,862,757.

(30) Foreign Application Priority Data

Sep. 30, 2020  (FR) ..................................... 2009984

(51) Int. Cl.
  *H01L 33/48*    (2010.01)
  *H01L 31/0203*  (2014.01)
  *H01L 31/18*    (2006.01)
  *H01L 33/00*    (2010.01)
(52) U.S. Cl.
  CPC ........ *H01L 33/483* (2013.01); *H01L 31/0203* (2013.01); *H01L 31/18* (2013.01); *H01L 33/005* (2013.01)

(58) Field of Classification Search
  CPC . H01L 33/483; H01L 33/005; H01L 31/0203; H01L 31/18; H01L 27/14618
  See application file for complete search history.

(56) References Cited

U.S. PATENT DOCUMENTS

| | | | | |
|---|---|---|---|---|
| 5,013,871 A | * | 5/1991 | Mahulikar | ............... H01L 21/50 257/E23.101 |
| 5,612,576 A | * | 3/1997 | Wilson | ................ H01L 23/3128 257/793 |
| 7,675,149 B1 | * | 3/2010 | Strittmatter | ........... H01L 23/055 257/E23.001 |

(Continued)

FOREIGN PATENT DOCUMENTS

| | | |
|---|---|---|
| JP | 2006303481 A | 11/2006 |
| WO | WO 2012165647 A1 | 12/2012 |

OTHER PUBLICATIONS

T.-K. Lee, S. Han, Y.-S. Ko and J.-H. Kim, "Some Case Studies on Air Venting Analysis of Semiconductor Packages using MoldflowTM," 2008 10th Electronics Packaging Technology Conference, Singapore, 2008, pp. 444-449, doi: 10.1109/EPTC.2008.4763474 (Year: 2008).*

*Primary Examiner* — Sitaramarao S Yechuri
(74) *Attorney, Agent, or Firm* — Seed IP Law Group LLP (57) ABSTRACT

The present description concerns a package for an electronic device. The package including a plate and a lateral wall, separated by a layer made of a bonding material and at least one region made of a material configured to form in the region an opening between the inside and the outside of the package when the package is heated.

20 Claims, 7 Drawing Sheets

(56) References Cited

U.S. PATENT DOCUMENTS

| | | | | |
|---|---|---|---|---|
| 8,258,013 | B1* | 9/2012 | Nagarajan | H01L 23/564 |
| | | | | 438/106 |
| 2004/0262741 | A1* | 12/2004 | Koike | H01L 27/14806 |
| | | | | 257/E23.185 |
| 2005/0161755 | A1* | 7/2005 | Huang | H01L 31/0203 |
| | | | | 257/E31.117 |
| 2006/0237829 | A1* | 10/2006 | Hosomi | H01L 23/467 |
| | | | | 257/E23.099 |
| 2014/0008753 | A1* | 1/2014 | Tsuduki | H01L 31/02366 |
| | | | | 257/433 |
| 2018/0006003 | A1* | 1/2018 | Nagarajan | H01L 31/1892 |
| 2018/0130719 | A1* | 5/2018 | Fang | H01L 21/52 |
| 2021/0175135 | A1* | 6/2021 | Hsu | H01L 31/0203 |

* cited by examiner

ELECTRONIC PACKAGE

BACKGROUND

Technical Field

The present description generally concerns electronic devices and more particularly packages, for example, packages comprising optoelectronic devices, and their manufacturing methods.

Description of the Related Art

It is current to commercialize electronic components or electronic devices located in a package. The package for example comprises a support, forming the lower side of the package, an upper plate forming the upper side of the package, and a wall forming the lateral sides of the package.

The package is generally fastened and electrically connected to another device. However, the package fastening step may cause damage to the package.

BRIEF SUMMARY

An embodiment overcomes all or part of the disadvantages of known packages.

An embodiment provides a package for an electronic device, the package comprising a plate and a lateral wall, separated by a layer of a bonding material and at least one region made of a material configured to form in the region an opening between the inside and the outside of the package when the package is heated.

Another embodiment provides a method of manufacturing a package for an electronic device, the package comprising a plate and a lateral wall, the method comprising the forming of a layer made of a bonding material and at least one region, separating the plate and the wall, the region being made of a material configured to form in the region an opening between the inside and the outside of the package when the package is heated.

According to an embodiment, the region is configured to form the opening when the package is heated to a temperature greater than 150° C.

According to an embodiment, the lateral wall is made of resin.

According to an embodiment, the plate is made of glass.

According to an embodiment, said region is located between the wall and the plate.

According to an embodiment, the device located in the package is an optoelectronic device, which in some embodiments is a camera.

According to an embodiment, the device and the wall rests on a support, the support comprising conductive elements coupling the device to solder elements located under the support.

According to an embodiment, the plate is the support.

According to an embodiment, the opening is configured to form during a step of soldering of the solder elements.

According to an embodiment, the package is configured to be tight before the solder step.

According to an embodiment, the package is cleaned or rinsed with a liquid before the solder step.

According to an embodiment, the method comprises the deposition of a mold on the support and the injection of resin into the mold to form the wall.

According to an embodiment, the method comprises the forming of the wall separately from the support and the bonding of the wall to the support with a bonding layer.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the applications of the device located in the package will not be detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and, in some embodiments, within 5%.

Figure 1A:
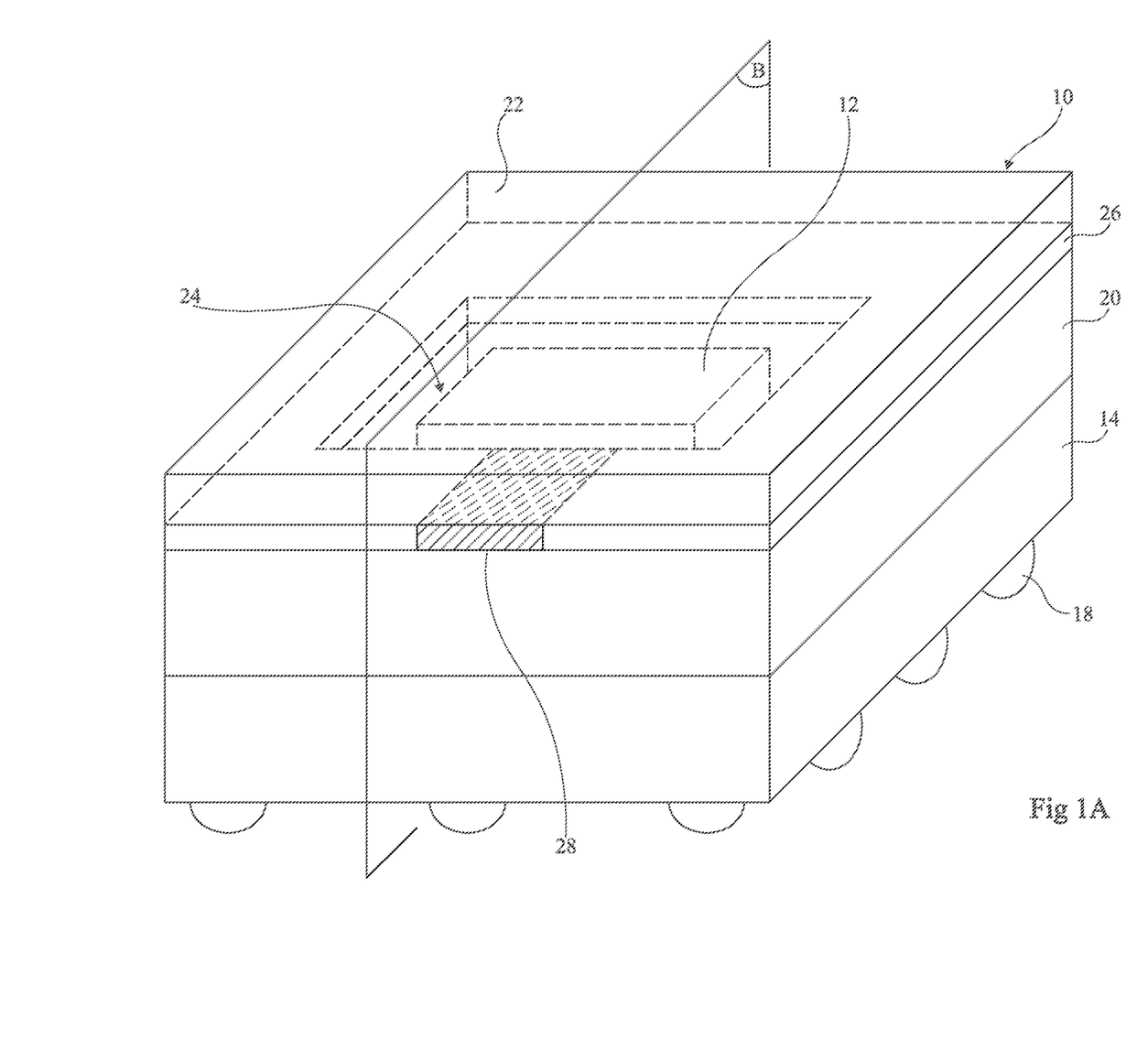
FIG. 1A is a perspective view of an embodiment of a package comprising an optoelectronic device.
Figure 1B:
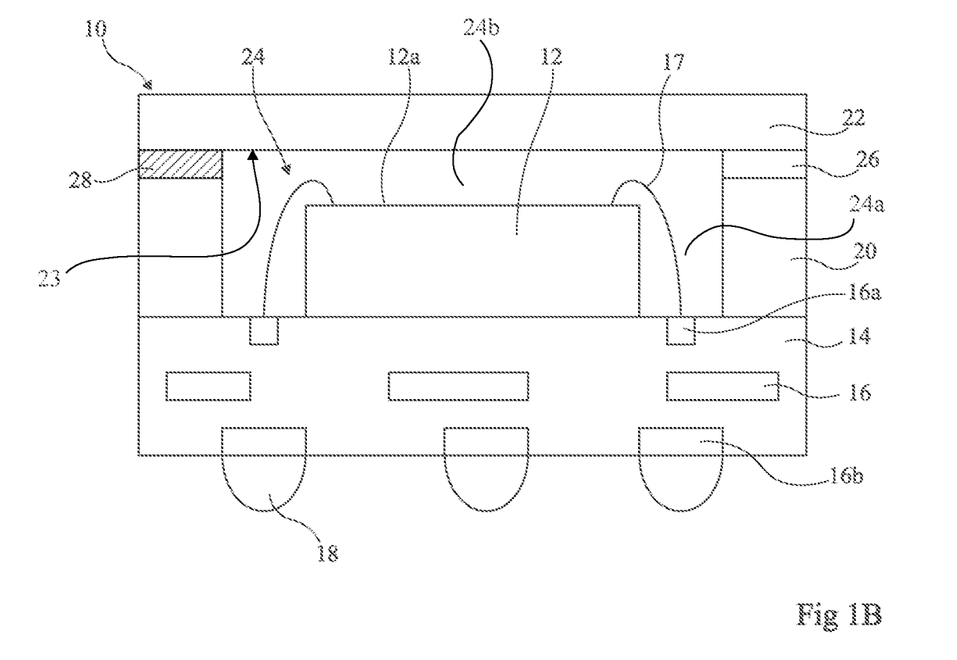
FIG. 1B is a cross-section view of the embodiment of FIG. 1A.

FIG. 1A is a perspective view of an embodiment of a package 10 comprising an optoelectronic device 12. FIG. 1B is a cross-section view of the embodiment of FIG. 1A in plane B of FIG. 1A. In alternative embodiments, the optoelectronic device 12 may instead be replaced with a die, an electronic component, or some other type of electronic device.

In some embodiments, device 12 is an optoelectronic device. In some embodiments, device 12 is a device receiving or emitting light radiations. In some embodiments, the device 12 is a device receiving or emitting light radtions via an upper surface 12a. Device 12 is, for example, an image sensor, which may be, for example, a video camera.

Package 10 comprises a support 14. Support 14 forms the lower surface or plate of the package. In some embodiments, device 12 rests on support 14. Support 14 comprises conductive elements 16 enabling to electrically connect the upper surface of support 14 to the lower surface of support 14. In some embodiments, support 14 is made of an insulating material having the conductive elements located therein. For example, conductive elements 16 are conductive tracks. For example support 14 comprises levels of conductive tracks 16 electrically coupled to one another by conductive vias, not shown. In some embodiments, support 14 comprises conductive tracks 16a flush with the upper surface of support 14 and allowing electric connections with device 12, for example, by electric wires 17, not shown in FIG. 1A. Support 14 further comprises tracks 16b, or pads 16b, flush with the lower surface of support 14.

Solder balls 18 are for example located on tracks 16b. Package 10 may thus be soldered to another device, not shown, by solder balls 18. As a variant, solder balls 18 may be replaced with other metal elements enabling to solder package 10 to the other device. Thus, a metal land grid array (LGA) or a solder paste may be formed on the lower surface of support 14, to replace balls 18. Electric connections may thus be formed between the device 12 located in package 10 and the other device via wires 17, tracks 16, and solder elements, for example, balls 18 or lands.

Package 10 further comprises a wall 20. Wall 20 is for example made of plastic, of resin, of ceramic, or of an organic material. In some embodiments, wall 20 is made of resin. The wall may be referred to as a layer, which may be made, for example, of plastic, of resin (e.g., molding compound or encapsulant), of ceramic, of an organic material, or some other suitable type of material. Wall 20 forms the lateral contour of package 10. Wall 20 thus forms the lateral surfaces of package 10. Wall 20 rests on support 14. Wall 20 extends from package 10. Thus, wall 20 extends on the periphery of the upper surface of support 14. Wall 20 extends around device 12.

In some embodiments, wall 20 is separated from device 12 by a gap 24a, for example, filled with air. The gap 24a may be a portion of cavity 24. Gap 24a extends from wall 20 to sidewalls of device 12. In some embodiments, wall 20 is a continuous wall.

In some embodiments, wall 20 is at least as tall as device 12 based on the orientation as shown in FIG. 1B. Thus, in some embodiments, the upper surface of wall 20 is located above device 12 based on the orientation as shown in FIG. 1B.

A plate 22 is bonded to wall 20. The plate 22 thus forms the upper surface of package 10. Plate 22 includes a first surface 23 that faces towards the device 12, the support 14, and the wall 20. Package 10 thus comprises support 14, wall 20, and plate 22. Support 14, wall 20, and plate 22 form an inner cavity 24 having device 12 located therein. Support 14, wall 20, and plate delimit inner cavity 24 in which device 12 is located therein. In some embodiments, cavity 24 is filled with air, which surrounds device 12.

Plate 22 is rigid, that is, the shape of the plate 22 is not modified during its placing on wall 20. In particular, plate 22 does not stretch in the cavity 24 of package 10. In particular, in some embodiments, plate 22 comprises planar upper and lower surfaces parallel to each other. Thus, in some embodiments, plate 22 is not in contact with device 12. In some embodiments, plate 22 is separated from device 12 by a gap 24b, which is in some embodiments filled with air. Gab 24b being a portion of cavity 24, and gap 24b extends from upper surface of device 12 to lower surface 24b of plate 22.

In some embodiments, plate 22 is made of a transparent material. In particular, if device 12 is an optoelectronic device, plate 22 is made of a material transparent to the wavelengths emitted and/or received by device 12. For example, if device 12 is a video camera, plate 22 is transparent to visible wavelengths. In some embodiments, plate 22 is made of glass.

Package 10 further comprises a bonding layer 26, bonding plate 22 to wall 20. Package 10 further comprises a region 28 between plate 22 and wall 20. In some embodiments, layer 26 is a glue layer. Layer 26 rests on top of and in contact with the upper surface of wall 20. Plate 22 rests on top of and in contact with layer 26. Layer 26 extends on the upper surface of wall 20, continuously around cavity 24, except for the location of region 28. Thus, in some embodiments, layer 26 extends over the entire upper surface of wall 20 except for the location of region 28. In other words, layer 26 comprises an opening totally filled with the material of region 28. Thus, region 28 and layer 26 form a continuous ring surrounding cavity 24. Region 28 is thus in contact with layer 26. The inner layer 24 of package 10, and thus device 12, is thus totally surrounded with package 10. Plate 22 is thus separated from wall 20 by layer 26 or region 28.

Region 28 extends from the inner cavity 24 of package 10, that is, the inside of package 10, to the outside of package 10. Thus, region 28 is not separated from the inner cavity 24 of package 10 and is not separated from the outside of package 10. In particular, region 28 is not separated from the inner cavity 24 of package 10 and from the outside of package 10 by layer 26. The inner cavity 24 of package 10 is thus directly separated from the outside of package 10 by region 28.

Region 28 for example has a parallelepipedal shape. Region 28 for example comprises:
- a surface, which is in some embodiments a lateral surface, is in contact with the inside of package 10. In some embodiments, the surface is in contact with the air contained in the inner cavity 24 of package 10;
- a surface, which is in some embodiments a lateral surface, is in contact with the outside of package 10. In some embodiments, the surface is in contact with the air located outside of package 10;
- a surface, which is in some embodiments an upper surface, is in contact with plate 22;
- a surface, which is in some embodiments a lower surface, is in contact with wall 20; and
- two surfaces, which are in some embodiments lateral surfaces. In some embodiments, the two surfaces are opposite to each other, and are in contact with layer 26.

Package 10 thus comprises an assembly of plate 22 on an assembly comprising wall 20 and support 14. In some embodiments, the plate 22 is separated from wall 20 by two distinct materials, which are in some embodiments only two materials, that is, the material for bonding layer 26 and the material of region 28.

Package 10 may be submitted, after its forming, for example, after the steps described in relation with FIGS. 2A to 2E, to a cleaning or rinsing step. The cleaning or rinsing step is for example carried out with a liquid, for example, with water. During this rinsing step, package 10 is tight, that is, the liquid dos not penetrate into the inner cavity 24 of package 10. In other words, the material of bonding layer 26 and the material of region 28 are tight, that is, they are such that the bonding between plate 22 and wall 20 is tight. In other words, a seal is formed between the material of bonding layer 26, the material of region 28, and the plate such that liquid does not penetrate into the inner cavity 24 of package 10. There thus is no opening between plate 22 and wall 20 during this step.

After the cleaning or rinsing step, package 10 may be stored for a long time, for example, for several days, or even several weeks, before being fastened, for example, by balls 18 or by another solder element, to another device. The fastening step corresponds to a step of soldering, for example, of balls 18, in other words to a step of melting of the solder elements located on the lower surface of support 14, for example, balls 18, on the other device. Package 10 is thus heated up to a temperature, for example, greater than 150° C.

During the storage period, humidity may propagate in the inner cavity 24 of package 10, for example, via support 14, or wall 20.

During the step of melting of the solder elements, for example, balls 18, the humidity in the inner cavity 24 of package 10 turns into vapor and increases the pressure in the inner cavity 24 of package 10. The material of region 28 is selected in such a way that region 28 degrades under the pressure of the water vapor during this melting step and forms an opening. Region 28 thus forms an exhaust valve for package 10.

The melting temperature of the solder elements, for example balls 18, depends on the material of the solder elements, for example, balls 18. The solder elements are made of metal and in some embodiments have a melting temperature greater than 150° C., in some embodiments have a melting temperature greater than 200° C., and in some embodiments have a melting temperature greater than 250° C. Thus, the material of region 28 is selected to form an opening between the outside of package 10 and the inner cavity 24 of package 10 at the melting temperature of the solder elements, that is, in some embodiments at a temperature greater than 150° C., in some embodiments greater than 200° C., and in some embodiments greater than 250° C. The opening extends from the inner cavity 24 to an external environment outside of package 10.

In some embodiments, region 28 is configured to form an opening when the pressure in the inner cavity 24 of package 10 reaches a value greater than 1 atmosphere. However, in some embodiments, the pressure in the inner cavity 24 of the package 10 reaches a value greater than 1.5 atmosphere.

Region 28 thus forms a vent in package 10 during the step of melting of the solder elements. Region 28 thus enables to degas the inner cavity 24 of package 10.

For example, the region is made of a material which is flexible, stretchable, and/or deformable in such a way that during the melting step, at least a portion of the surface of region 28 located closest to the inner cavity 24 of package 10 displaces to end up outside of package 10. For example, the region is made of a material flexible, stretchable, and/or deformable in such a way that during the melting step, an air bubble forms in region 28 and bursts outside of cavity 24. In some embodiments, material of region 28 remains after the forming of the opening.

For example, the material of region 28 has an adherence to the material of plate 22, of layer 26, and/or of wall 20 such that, during the step of melting of the solder elements, the pressure causes the separation of region 28 and of plate 22, of layer 26, and/or of wall 20, which enables air to flow outside of package 10. In other words, the pressure generated during the melting step may cause the delamination of the material of region 28.

For example, the material of region 28 is a porous material, capable of being crossed by air but not by water.

For example, the material of region 28 is a viscous material, for example, a gel enabling, under the pressure generated during the melting step, to allow the passage of air. In some embodiments, the material of region 28 is a silicone. In some embodiments, the material of region 28 is a silicone gel. The opening formed in region 28 may then close back after the passage of air.

In some embodiments, the opening formed in region 28 is definitive. In other words, material 28, in some embodiments, does not recover its original shape after the melting step. In other words, the opening is permanent once formed.

It could have been chosen not to form a region 28. Bonding layer 26 would then form a continuous ring surrounding the inner cavity 24 of package 10 and making the cavity tight. During the storage period, the cavity 24 of package 10 might accumulate enough humidity for the pressure formed in cavity 24 during the melting of the solder elements to damage package 10, in particular to damage wall 20, support 14, or plate 22. The generated damage would then be in unexpected locations and might disadvantageously modify the structure of package 10.

FIGS. 2A to 2E show the result of steps, which are in some embodiments successive, of an example of a method of manufacturing the embodiment of FIGS. 1A and 1B. FIGS. 2A to 2E are cross-section views in the plane of FIG. 1B. More particularly, FIGS. 2A to 2E show steps of forming of three packages 10, each comprising a device 12. More generally, the manufacturing steps described in relation with FIGS. 2A to 2E are, for example, carried out from a plate 40 enabling to form a plurality of packages 10.

Figure 2A:
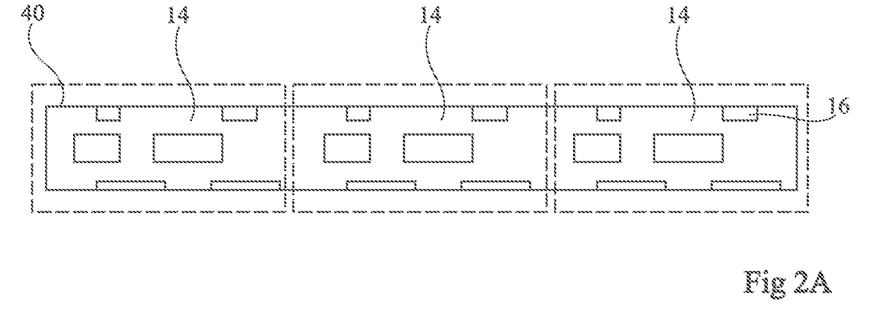
FIG. 2A shows the result of a step of manufacturing the embodiment of FIGS. 1A and 1B.

FIG. 2A shows the result of a step of manufacturing of the embodiment of FIGS. 1A and 1B.

During this step, the support 14 of each package 10 is formed. In particular, tracks 16 are formed to form supports 14. In some embodiment the tracks 16 are formed in an insulating material.

In other words, plate 40, in some embodiments, comprises a plurality of supports 14, is formed. FIG. 2A shows three supports 14, each surrounded with dotted lines, in plate 40.

The tracks 16 of supports 14 will not be detailed in the following drawings.

Figure 2B:
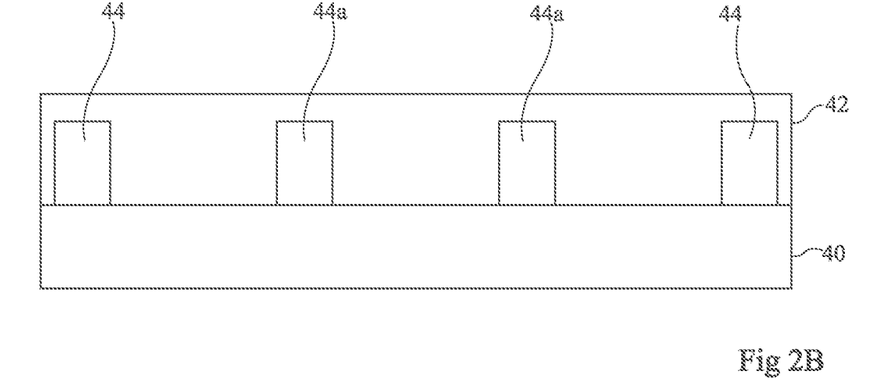
FIG. 2B shows the result of a step of manufacturing the embodiment of FIGS. 1A and 1B.

FIG. 2B shows the result of a step of manufacturing the embodiment of FIGS. 1A and 1B.

During this step, a mold 42 is placed on plate 40. Mold 42 is located in contact with the surface of plate 40 having the walls 20 of the different packages 10 located thereon.

Mold 40 comprises cavities 44 at the locations of walls 20. Cavities 44 are located on the side of plate 40. Certain cavities 44 may correspond to the walls 20 of a plurality of neighboring packages 10. Thus, FIG. 2B shows cavities 44a having dimensions substantially corresponding to two walls 20 side by side. The two walls will be separated afterwards, during the individualization of packages 10.

Mold 42 further comprises openings, not shown, providing access to cavities 44 when the mold is in contact with plate 40. More particularly, said openings, not shown, are openings intended to be used to place the material of walls 20 in the cavities 44 of mold 42.

Figure 2C:
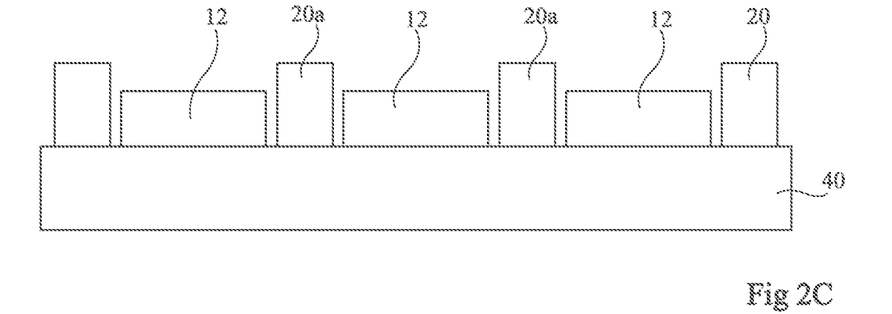
FIG. 2C shows the result of a step of manufacturing the embodiment of FIGS. 1A and 1B.

FIG. 2C shows the result of a step of manufacturing the embodiment of FIGS. 1A and 1B.

During this step, the material of walls 20 is placed in cavities 44 by the openings, not shown. For example, the material of walls 20 is a resin. The resin is for example heated to become liquid. The liquid resin is then sent into cavities 44 via openings, not shown. The resin is then cooled to take a solid state.

Devices 12 are then placed on plate 40. Each device 12 is placed to be surrounded with a wall 20.

More generally, this step comprises the forming of the various elements located in the inner cavity 24 of each package 10. This step thus comprises, for example, the forming of electric wires, not shown, coupling a device 12 to tracks 16.

Figure 2D:
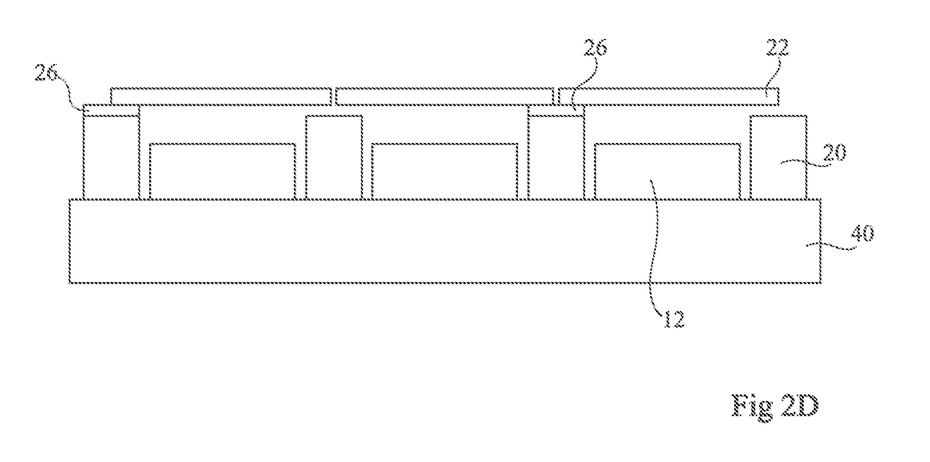
FIG. 2D shows the result of a step of manufacturing the embodiment of FIGS. 1A and 1B.

FIG. 2D shows the result of a step of manufacturing of the embodiment of FIGS. 1A and 1B.

During this step, a bonding layer corresponding to the bonding layers 26 of packages 10 is formed on walls 20, particularly on the upper surface of walls 20. The bonding layer is not located at the locations of regions 28. The locations of regions 28 are thus kept empty.

During this step, the plates 22 of each package 10 are placed on the layer 26 of the corresponding package 10. In some embodiments, layers 26 have been placed in such a way that when plates 22 rest on layers 26, the material of layers 26 does not overflow into the locations of regions 28.

Bonding layers 26 are then, for example, heated, for example, at a temperature in the range from 80° C. to 200° C. and/or placed under UV (Ultraviolet) light, to solidify the material of layers 26 and to bond plates 22 to walls 20.

In some embodiments, the only openings in the rings formed by layers 26 are located at the locations of regions 28.

Figure 2E:
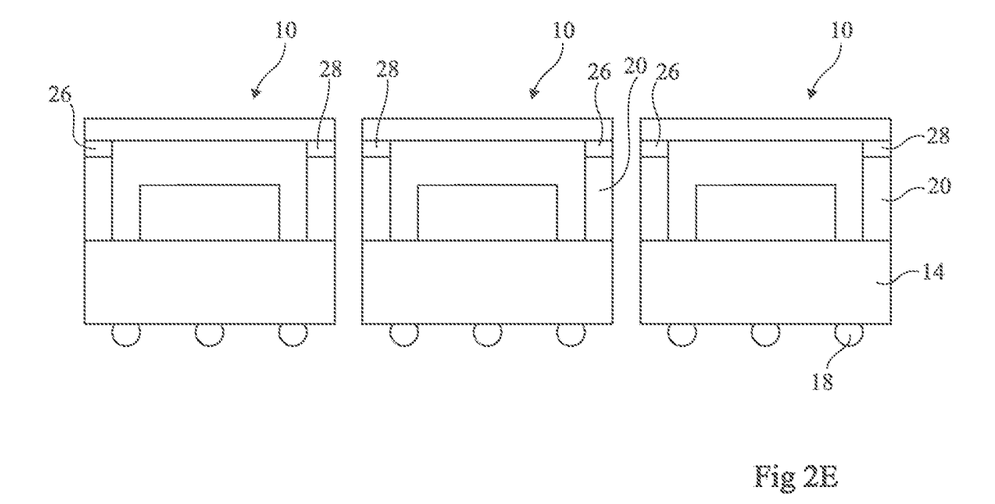
FIG. 2E shows the result of a step of manufacturing the embodiment of FIGS. 1A and 1B.

FIG. 2E shows the result of a step of manufacturing the embodiment of FIGS. 1A and 1B.

During this step, the locations of regions 28 are filled with the material of regions 28.

During this step, packages 10 are individualized. In other words, plate 40, walls 20a, and layers 26 are cut to separate the different packages 10. In other words, plate 40 is separated into a plurality of supports 14, walls 20a are separated into a plurality of walls 20, and layers 26 are separated to form the layers 26 of the different packages 10.

In some embodiments, plates 22 are placed to be sufficiently separated from one another to enable to individualize packages 10, in other words to enable to separate walls 20a and supports 14 between plates 22.

During this step, balls 18 are bonded to tracks on the lower surface of each support 14. As a variant, balls 18 or, more generally the solder elements, may be formed later on, for example before the step of soldering package 10 to another device, for example, after the rinsing step.

The filling of regions 28, the individualization of packages 10, and the placing of balls 18 may be performed in a different order.

As a variant, the steps illustrated by FIGS. 2B and 2C may be replaced with steps during which: a mesh network corresponding to the walls 20 corresponding to the supports 14 of plate 40 is formed separately from plate 40; and said mesh network is bonded to plate 40 by a bonding layer, which is in some embodiments a glue layer. The bonding between wall 20 and support 14 is, in this embodiment, tight. The placing of devices 12 is performed as described in relation with FIG. 2C. The next steps are then for example carried out as described in relation with FIGS. 2D and 2E.

Figure 3:
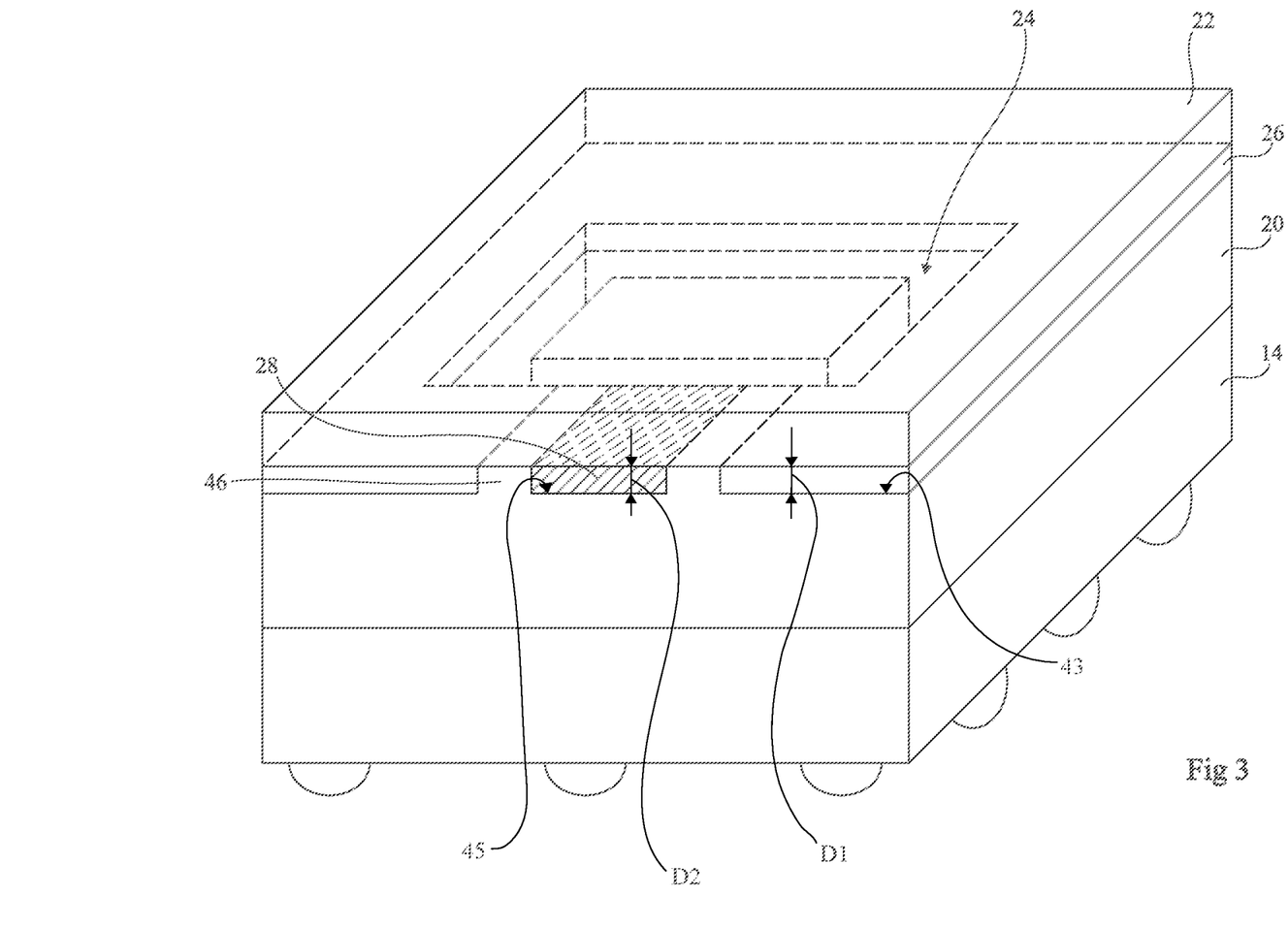
FIG. 3 shows a variant of the embodiment of FIGS. 1A and 1B.

FIG. 3 shows a variant of the embodiment of FIGS. 1A and 1B. More particularly, FIG. 3 is a cross-section view of a variant of the embodiment of FIGS. 1A and 1B. FIG. 3 comprises the elements of FIGS. 1A and 1B, which will not be described again.

The embodiment of FIG. 3 differs from the embodiment of FIGS. 1A and 1B in that region 28 is separated from layer 26 by portions 46.

Portions 46 extend from the upper surface of wall 20. Portions 46 extend all the way to plate 22. Portions 46 are thus in contact, by an upper surface, with plate 22 and, by a lower surface, with wall 20. In some embodiments, each portion 46 extends from the outside of package 10 to inner cavity 24. In some embodiments, portions 46 are made of the material of wall 20. The portions 46 may be integral with the wall 20 such that portions 46 and wall 20 are made of a continuous and unitary material. The portions 46 may be extension or protrusions that extend outward from lateral wall 20.

In the example of FIG. 3, package 10 comprises two portions 46 only. Each of the two portions is located between a lateral surface of region 28 and layer 26. Region 28 is thus not in contact with layer 26. The region delimited by the two portions 46, plate 22, and by wall 20 is totally (e.g., entirely) filled with region 28. Region 28 is thus in contact with portions 46. Similarly, layer 26 is in contact with portions 46, and, in some embodiments, with all portions 46.

The method of manufacturing the embodiment of FIG. 3 differs from the method described in relation with FIGS. 2A to 2E by the shape of mold 42. Indeed, mold 42 in a method of manufacturing the embodiment of FIG. 3 comprises cavities 44 having the shape of wall 20 and of portions 46. Portions 46 are thus formed during the forming of wall 20, by injection of the material of wall 20 into cavities 44. Afterwards, layer 26 is deposited all over the upper surface of wall 20 outside of the location of region 28. In some embodiments, the thickness of layer 26 is selected in such a way that the upper surface of layer 26, after the bonding of plate 22, is substantially coplanar with the upper surfaces of portions 46.

An advantage of the embodiment of FIG. 3 is that it is possible to better control the dimensions of region 28. Indeed, layer 26 cannot overflow on the location of region 28, the material of layer 26 being blocked by portions 46.

As shown in FIG. 3, wall 20 includes a second surface 43 and a third surface 45 separated from each other by the portions 46. Layer 26 is on the second surface 43 and region 28 of material is on the third surface 45. Layer 26 includes a first dimension D1 that extends from the second surface 43 to plate 22, and region 28 of material includes a second dimension D2 that extends from the third surface 45 to the plate 22. In this embodiment, the first dimension D1 is substantially equal to or equal to the second dimension D2. In some embodiments, the first dimension D1 may be greater than the first dimension D2 such that the third surface 45 is closer to plate 22 as compared to the second surface 43.

Figure 4:
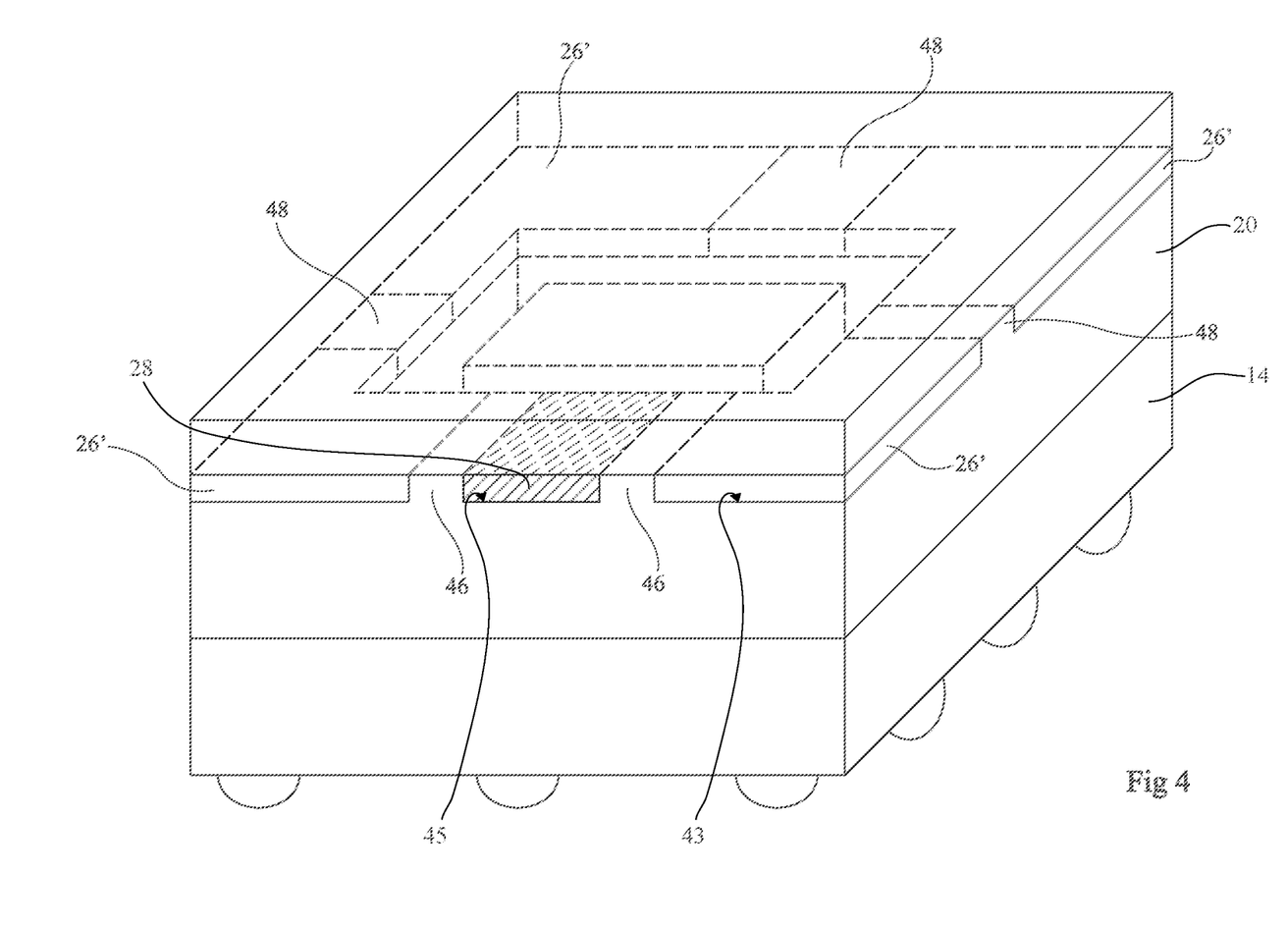
FIG. 4 shows another variant of the embodiment of FIGS. 1A and 1B.

FIG. 4 shows another variant of the embodiment of FIGS. 1A and 1B. More particularly, FIG. 4 is a cross-section view of a variant of the embodiment of FIGS. 1A and 1B. FIG. 4 comprises the elements of FIGS. 1A and 1B and the elements of FIG. 3, which will not be described again.

The embodiment of FIG. 4 differs from the embodiment of FIG. 3 in that layer 26 is separated into a plurality of portions 26' by portions 48.

Portions 48 extend from the upper surface of wall 20. Portions 48 extend all the way to plate 22. Portions 48 are thus in contact, by an upper surface, with plate 22, and by a lower portion with wall 20. Portions 48 are made of the material of wall 20. In some embodiments, each portion 48 extends from the outside of package 10 to inner cavity 24. As a variant, portions 48 may have a different shape. For example, portions 48 may not extend from the outside of package 10 to inner cavity 24, but only over a portion of the dimension, from the outside of package 10 to inner cavity 24. The portions 48 may be integral with the wall 20 such that portions 48 and wall 20 are made of a continuous and unitary material. The portions 48 may be extension or protrusions that extend outward from lateral wall 20.

In the embodiment of FIG. 4, package 10 comprises three portions 48. Each portion 48 is located on a side of package 10. More particularly, in the embodiment of FIG. 4, layer 26 comprises four portions substantially rectangular in top view, each portion being separated, for example, substantially in the middle, by a portion 48 or by portions 46 and region 28. In other words, layer 26 comprises four portions, located on the angles of the upper surface of wall 20, each portion being separated from the neighboring portion by a portion 48 or by portions 46 and region 48.

More generally, package 10 may comprise at least one portion 48, preferably located opposite region 46, to keep plate 22 horizontal. Preferably, package 10 comprises at least two portions 48. Preferably, the at least two portions 48 are located on different sides of package 10 to hold plate 22.

Plate 22 is preferably separated from wall 20 by two distinct materials, preferably two materials only, other than the materials of wall 20, that is, the bonding material of layer 26 and the material of region 28.

As a variant, at least one of portions 48 may be replaced with a region 28. Said region 28 may for example be surrounded with portions 46.

Figure 5:
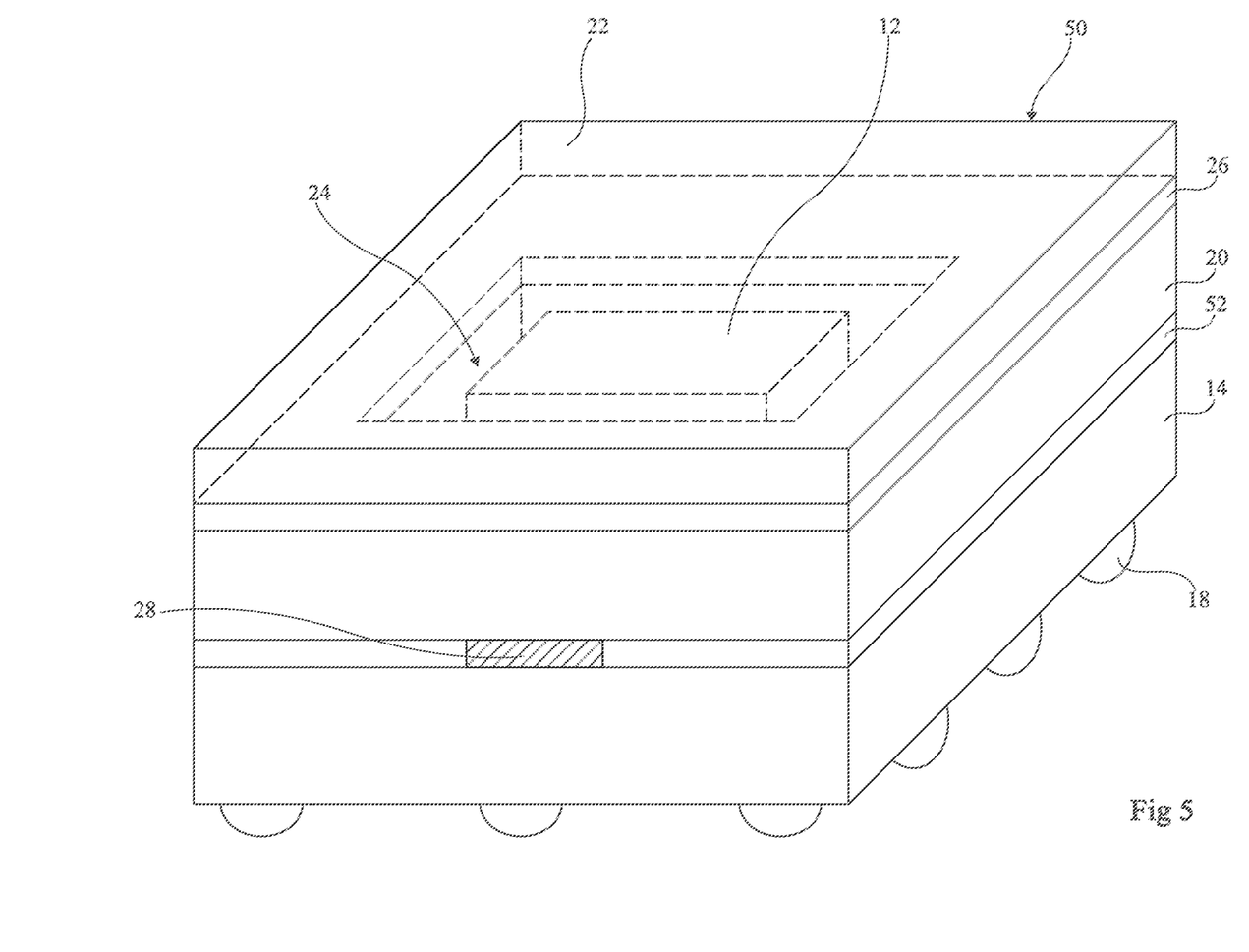
FIG. 5 shows another variant of the embodiment of FIGS. 1A and 1B.

FIG. 5 shows another variant of the embodiment of FIGS. 1A and 1B. The embodiment of FIG. 5 comprises a package 50 which differs from the package 10 of FIGS. 1A and 1B in that wall 20 is bonded to support 14 by a bonding layer 52 and that region 28 is located between wall 20 and support 14.

As the package 10 of FIGS. 1A and 1B, package 50 comprises support 14, the solder elements, for example, balls 18, wall 20, and plate 22.

Plate 22 is bonded to wall 20 by layer 26. Layer 26 totally surrounds the inner cavity 24 of package 50. Thus, the upper surface of wall 20 is, in some embodiments, totally covered to bond plate 22 to wall 20. Plate 22 is thus separated from wall 20 by a single material, the bonding material. The bonding between wall 20 and plate 22 is then tight. In other words, the bonding between wall 20 and plate 22, in some embodiments, does not allow the passage of liquid.

Wall 20 is, in this embodiment, formed separately from support 14, as described as a variant of the manufacturing method of FIGS. 2A to 2E. Wall 20 is thus bonded to support 14 by bonding layer 52.

Region 28 is, in this embodiment, located between wall 20 and support 14, in the same way as region 28 is located between plate 22 and wall 20 in the embodiment of FIGS. 1A and 1B. Wall 20 and support 14 are thus separated by layer 52 and region 28.

The method of manufacturing package 50 for example comprises:
the forming of support 14, for example, the forming of a plurality of supports 14 in a same plate;
the forming of a mesh network of walls 20 separated from supports 14, as previously described;
the deposition of layers 52 and of the material of regions 28 on supports 14;
the placing of the mesh network on supports 14 and its bonding, for example, by heating;
the placing of the elements contained in the packages;
the forming of insulating layer 26; and
the individualization of packages 50.

As a variant, the forming of region 28 may be performed after the individualization of packages 50.

An advantage of the described embodiments is that they avoid damage to wall 20, to support 14, and to plate 22 during the melting of balls 18.

Another advantage of the described embodiments is that the package is tight during the cleaning or rinsing step.

Another advantage of the described embodiments is that the package comprises, in a way, an air vent valve during the step of melting of balls 18.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

Package (10) for an electronic device (12), the package may be summarized as including a plate (14, 22) and a lateral wall (20), separated by a layer made of a bonding material and at least one region (28) made of a material configured to form in the region (28) an opening between the inside and the outside of the package when the package is heated.

Method of manufacturing a package (10) for an electronic device (12), the package may include a plate (14, 22) and a lateral wall (20), the method may be summarized as including the forming of a layer made of a bonding material and at least one region (28), separating the plate and the wall, the region being made of a material configured to form in the region (28) an opening between the inside and the outside of the package when the package is heated.

The region (28) may be configured to form the opening when the package (10) is heated up to a temperature greater than 150° C.

The lateral wall (20) may be made of resin.

The plate (22) may be made of glass.

Said region (28) may be located between the wall (20) and the plate (22).

The device (12) located in the package (12) may be an optoelectronic device, and, in some embodiments, the optoelectronic device is a camera.

The device (12) and the wall (20) may rest on a support (14), the support including conductive elements (16) coupling the device (12) to solder elements (18) located under the support (14).

The plate may be the support (14).

The opening may be configured to form during a step of soldering of the solder elements (18).

The package (10) may be configured to be tight before the solder step.

The package (10) may be cleaned or rinsed with a liquid before the solder step.

Method may include the deposition of a mold (42) on the support (14) and the injection of resin into the mold to form the wall (20).

Method may include the forming of the wall (20) separately from the support (14) and the bonding of the wall to the support with a bonding layer (52).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a support including a first side and a second side opposite to the first side;
a wall on the first side of the support, the wall including one or more inner sidewalls, one or more outer sidewalls opposite to the one or more inner sidewalls, a first surface that faces away from the support and extends from the one or more inner sidewalls to the one or more outer sidewalls, and a cavity defined by the one or more inner sidewalls, the wall further includes a first corner portion, a second corner portion spaced apart from the first corner portion, and an intermediate portion that is between the first corner portion and the second corner portion and extends from the first corner portion to the second corner portion;
an electronic device within the cavity, the electronic device including one or more sidewalls;
a gap extends from the one or more inner sidewalls of the wall to the one or more sidewalls of the electronic device, and the gap separates the one or more inner sidewalls of the wall from the one or more sidewalls of the electronic device;
a bonding layer on the first surface of the wall;
a plate coupled to the bonding layer, the plate extends fully across the cavity, the plate having a second surface coupled to the bonding layer; and
a degradable material within the bonding layer, the degradable material extends from the first surface of the wall to the second surface of the plate, and the degradable material extends from a respective outer sidewall of the one or more outer sidewalls to a respective inner sidewall of the one or more inner sidewalls, and
wherein the respective inner sidewall extends from the first corner portion to the second corner portion, the respective outer sidewall extends from the first corner portion to the second corner portion, and the degradable material within the bonding layer is at and along the intermediate portion of the wall.

2. The device of claim 1, wherein the degradable material is position at a central region of the intermediate portion.

3. The device of claim 1, wherein:
one or more conductive elements are within the support;
one or more conductive tracks are at the second side of the support; and
one or more conductive pads are at the first side of the support and are overlapped by the gap, the one or more conductive pads are between the one or more inner sidewalls of the wall and the one or more sidewalls of the electronic device.

4. The device of claim 3, wherein one or more conductive wires couple the electronic device to the one or more conductive pads, and the one or more conductive wires extend through the gap and are between the one or more inner sidewalls of the wall and the one or more sidewalls of the electronic device.

5. The device of claim 3, wherein one or more solder balls are coupled to the one or more conductive tracks.

6. The device of claim 1, wherein the electronic device is on and coupled to the first side of the support.

7. The device of claim 6, wherein:
the electronic device has a first dimension in a direction directed from the first side of the support to the plate; and
the wall has a second dimension in the direction, the second dimension being equal to or greater than the first dimension of the electronic device.

8. The device of claim 1, wherein the gap includes:
a first portion that extends between the one or more inner sidewalls of the wall and one or more sidewalls of the electronic device; and
a second portion that extends between the electronic device and the plate, and the second portion of the gap separates the plate from the electronic device.

9. The device of claim 1, wherein:
the electronic device is an optoelectronic device; and
the plate is made of a transparent material.

10. The device of claim 9, wherein the transparent material is made of a material transparent to visible wavelengths.

11. A device, comprising:
a support including a first side and a second side opposite to the first side;
a first bonding layer coupled to the first side of the support;
a wall on the first bonding layer, the wall including one or more outer sidewalls, one or more inner sidewalls opposite to the one or more outer sidewalls, and a cavity defined by the one or more inner sidewalls, the wall further includes a first corner portion, a second corner portion spaced apart from the first corner portion, and an intermediate portion that is between the first corner portion and the second corner portion and extends from the first corner portion to the second corner portion;
a degradable material within the first bonding layer, on the support, and on the wall, the degradable material extending from a respective outer sidewall of the one or more outer sidewalls of the wall and a respective inner sidewall of the one or more inner sidewalls of the wall, the respective outer sidewall extends from the first corner portion to the second corner portion, the respective inner sidewall extends from the first corner portion to the second corner portion, and the degradable material within the first bonding layer is at and along the intermediate portion of the wall;
an electronic device within the cavity and on the support, the electronic device including one or more sidewalls;
a gap extends from the one or more inner sidewalls of the wall to the one or more sidewalls of the electronic device, and the gap separates the one or more inner sidewalls of the wall from the one or more sidewalls of the electronic device;
a second bonding layer on the wall, the second bonding layer is spaced apart from the first bonding layer by the wall; and
a plate on the second bonding layer, the plate extends fully across the cavity, the plate having a second surface coupled to the second bonding layer.

12. The device of claim 11, wherein the degradable material is position at a central region of the intermediate portion.

13. The device of claim 11, wherein:
one or more conductive elements are within the support;
one or more conductive tracks are at the second side of the support; and
one or more conductive pads are at the first side of the support and are overlapped by the gap, the one or more conductive pads are between the one or more inner sidewalls of the wall and the one or more sidewalls of the electronic device.

14. The device of claim 13, wherein one or more conductive wires couple the electronic device to the one or more conductive pads, and the one or more conductive wires extend through the gap and are between the one or more inner sidewalls of the wall and the one or more sidewalls of the electronic device.

15. The device of claim 13, wherein one or more solder balls are coupled to the one or more conductive tracks.

16. The device of claim 15, wherein:
the electronic device has a first dimension in a direction directed from the first side of the support to the plate; and
the wall has a second dimension in the direction, the second dimension being equal to or greater than the first dimension of the electronic device.

17. The device of claim 11, wherein:
the electronic device is an optoelectronic device; and
the plate is made of a transparent material.

18. The device of claim 17, wherein the transparent material is transparent to visible wavelengths.

19. A method, comprising:
forming a wall on a surface of a support plate by depositing a resin into a cavity of a mold, the wall being formed to include one or more inner sidewalls, one or more outer sidewalls opposite to the one or more inner sidewalls, a first surface that faces away from the support plate and extends from the one or more inner sidewalls to the one or more outer sidewalls, and a cavity defined by the one or more inner sidewalls, the wall further includes a first corner portion, a second corner portion spaced apart from the first corner portion, and an intermediate portion that is between the first corner portion and the second corner portion and extends from the first corner portion to the second corner portion;
coupling an electronic device to the surface of the support plate by inserting the electronic device within a cavity delimited by one or more inner sidewalls of the wall;
forming a bonding material on a surface of the wall facing away from the surface of the support plate, forming the bonding material includes leaving a region of the surface of the wall exposed from the bonding material;
coupling a plate to the bonding material; and
forming a degradable material on the region of the surface of wall exposed from the bonding material, the degradable material being within the bonding material, the degradable material is formed to extends from a respective outer sidewall of the one or more outer sidewalls to a respective inner sidewall of the one or more inner sidewalls, and
wherein the respective inner sidewall extends from the first corner portion to the second corner portion and the respective outer sidewall extends from the first corner portion to the second corner portion, and the degradable material is formed at and along the intermediate portion.

20. The method of claim 19, wherein:
the electronic device is an optoelectronic device; and
the plate is a made of a transparent material that is transparent to visible wavelengths.

* * * * *